(12) United States Patent
Volk et al.

(10) Patent No.: US 7,604,906 B1
(45) Date of Patent: Oct. 20, 2009

(54) FILMS FOR PREVENTION OF CRYSTAL GROWTH ON FUSED SILICA SUBSTRATES FOR SEMICONDUCTOR LITHOGRAPHY

(75) Inventors: William Volk, San Francisco, CA (US);
Ben Eynon, Round Rock, TX (US);
Brian Grenon, Colchester, VT (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 652 days.

(21) Appl. No.: 11/231,550

(22) Filed: Sep. 21, 2005

(51) Int. Cl.
*G03F 1/00* (2006.01)
(52) U.S. Cl. .......................... 430/5; 430/311; 430/322
(58) Field of Classification Search .................. 430/5, 430/311, 322
See application file for complete search history.

(56) References Cited

U.S. PATENT DOCUMENTS

| | | | |
|---|---|---|---|
| 5,484,671 A * | 1/1996 | Okamoto ........................ 430/5 |
| 6,364,946 B2 | 4/2002 | Staeblein et al. ............... 117/81 |
| 6,517,977 B2 * | 2/2003 | Resnick et al. ................. 430/5 |
| 6,653,024 B1 | 11/2003 | Shiraishi et al. |
| 6,673,520 B2 | 1/2004 | Han et al. ...................... 430/313 |
| 6,686,101 B2 | 2/2004 | McCullough |
| 6,740,159 B2 | 5/2004 | Kandler et al. ................ 117/19 |
| 6,759,171 B1 * | 7/2004 | Kalk ............................... 430/5 |
| 6,797,439 B1 * | 9/2004 | Alpay ............................ 430/5 |
| 6,869,734 B1 | 3/2005 | Lyons et al. .................... 430/5 |
| 6,872,497 B1 | 3/2005 | Levinson et al. ............... 430/5 |
| 6,890,688 B2 | 5/2005 | Mancini et al. |
| 7,271,950 B1 | 9/2007 | Gordon et al. |
| 2001/0049062 A1 * | 12/2001 | Kamon .......................... 430/5 |
| 2003/0165749 A1 * | 9/2003 | Fritze et al. .................... 430/5 |

OTHER PUBLICATIONS

Uta-Barbara Goers, "Fluence-Dependent Transmission (FDT) of Calcium Fluoride" SPIE Conference 2002.
U.S. Appl. No. 11/075,993 to William Volk et al., entitled "Use of Calcium Fluoride Substrate for Lithography Masks" filed Mar. 9, 2005.
Non-Final Office Action dated Aug. 7, 2008 for U.S. Appl. No. 11/075,993, 8 pages.

* cited by examiner

*Primary Examiner*—Mark F Huff
*Assistant Examiner*—Stewart A Fraser
(74) *Attorney, Agent, or Firm*—Joshua D. Isenberg; JDI Patent (57) ABSTRACT

Photolithography masks, systems and methods and more particularly to photolithography masks systems and methods for making and using silicon dioxide mask substrates are disclosed. The mask generally includes a silicon-dioxide mask substrate having a front surface, a patterned layer disposed on the front surface, and a coating of a fluoride of an element of group IIA that covers the patterned layer. The coating reduces undesired crystal growth on the silicon dioxide mask substrate. Such masks can be incorporated into photolithography systems and used in photolithography methods wherein a layer of photoresist is formed on a substrate and to radiation that impinges on the mask. Such a mask can be fabricated, e.g., by forming a patterned layer on a front surface of a silicon dioxide mask substrate and covering the patterned layer with a coating of a fluoride of an element of group IIA.

40 Claims, 4 Drawing Sheets

FILMS FOR PREVENTION OF CRYSTAL GROWTH ON FUSED SILICA SUBSTRATES FOR SEMICONDUCTOR LITHOGRAPHY

FIELD OF THE INVENTION

This invention generally relates to photolithography masks, systems and methods and more particularly to photolithography masks systems and methods for making and using silicon dioxide mask substrates.

BACKGROUND OF THE INVENTION

The semiconductor industry uses masks for photolithography techniques to form microscopic or sub-microscopic circuit elements such as integrated circuits. In photolithography a substrate, e.g., a semiconductor wafer is covered with a photoresist that reacts to exposure to radiation. Radiation from a source is focused onto the photoresist through a patterned mask, known as a reticle. In semiconductor pattern generation, the reticle is typically a glass or quartz substrate bearing the image of an integrated circuit. A reticle typically has a mask substrate, a patterned layer and a protective covering layer known as a pellicle. The pattern on the reticle corresponds to a portion or layer of the desired integrated circuit. Portions of the photoresist that are exposed to the radiation react with light such that they are either easily removed (for a positive resist) or resistant to removal (for a negative resist), e.g., by a solvent. After removal of portions of the resist, a reduced image of the pattern is transferred to the photoresist. Portions of the wafer may then be etched through openings in the pattern on the photoresist. Alternatively, material may be deposited on the wafer through the openings in the photoresist. The size of the features on the photoresist pattern is limited by diffraction. As successive generations of integrated circuits require smaller and smaller circuit features, shorter wavelengths of radiation must be used. The use of shorter wavelengths can have an undesirable impact on the material used as the mask substrate.

Amorphous fused silica (silicon dioxide) is widely used for transparent mask substrates for photolithography. Fused silica is also likely to be used for reflective mask substrates, particularly for extreme ultraviolet (EUV) lithography. Unfortunately, silicon dioxide surfaces can be highly reactive to 248-nm, 193-nm and 157-nm radiation in the presence of water. Reactions involving the silicon dioxide, water vapor and radiation can produce crystal growth on the surfaces of fused silica substrates. This crystal growth can cause patterning errors on semiconductor wafers. In extreme cases crystal growth can be so dense on the backside of the reticle that it can cause a global transmission loss through the reticle which can result in a global change of CD (critical dimensions) of lines on the wafer.

Calcium Fluoride ($CaF_2$) is a crystalline material that has been proposed for future 157-nm photolithography applications due to its preferable transmission characteristics at that wavelength. $CaF_2$ coatings and magnesium fluoride ($MgF_2$) coatings have been used on lenses in scanner optics as anti-reflective coatings, but not on photomasks. The thickness of these anti-reflective coatings is ¼ wavelength (e.g. 50 nm to 80 nm depending on DUV or i-line optics). $CaF_2$ masks were proposed since they provide a substantially water-free environment and are less susceptible to undesired crystal growth than silica-based substrates. Unfortunately, photo masks for 157-nm photolithography require a quartz pellicle since the 157-nm radiation tends to destroy the polymers commonly used as a pellicle material. Thus $CaF_2$ masks for 157-nm photolithography are relatively expensive compared to conventional photo masks. Development programs for 157-nm lithography have been stopped and engineering development resources focused on 193-nm immersion photolithography using fused silica mask substrates. Examples of masks for photolithography made using $CaF_2$ as a mask substrate are described in commonly-assigned U.S. patent application Ser. No. 11/075,993 to William Volk et al. and entitled "USE OF CALCIUM FLUORIDE FOR LITHOGRAPHY MASKS," which is incorporated herein by reference in its entirety. Although $CaF_2$-based photo-masks are advantageous in terms of susceptibility to crystal growth, fused silica is more advantageous in terms of cost and transmission properties for photolithography at 248-nm, 193-nm and 157-nm wavelengths.

Thus, there is a need in the art, for lithography masks characterized by relatively low cost, desirable optical transmission and resistance to undesired crystal growth.

SUMMARY OF THE INVENTION

An embodiment of the invention relates to a photolithography mask. The mask generally includes a silicon-dioxide mask substrate having a front surface, a patterned layer disposed on the front surface, and a coating of a fluoride of an element of group IIA that covers the patterned layer. The coating reduces undesired crystal growth on the silicon dioxide mask substrate.

Such photolithography masks can be incorporated into photolithography systems having a source of radiation, a substrate support and optics adapted to couple radiation between the source and the substrate support. The photolithographic mask is disposed along an optical path between the source of radiation and the substrate support.

Such masks can be used in a photolithography method wherein a layer of photoresist is formed on a substrate and to radiation that impinges on the mask (also known as a reticle).

Such masks can be fabricated, e.g., by forming a patterned layer on a front surface of a silicon dioxide mask substrate and covering the patterned layer with a coating of a fluoride of an element of group IIA. The group IIA fluoride coating can be formed by standard techniques including electron beam deposition (EBD) and ion beam deposition (IBD).

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
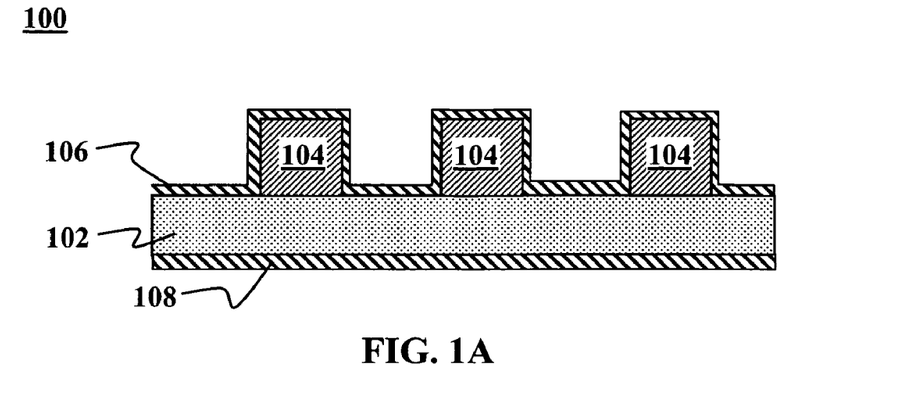
FIG. 1A is a cross-sectional schematic diagram of a photolithography mask according to an embodiment of the present invention.

FIG. 1A depicts an example of a photolithography mask 100 according to an embodiment of the present invention. It is noted that photolithography masks are often referred to as reticles and photomasks. Thus, these terms are used interchangeably herein. The mask 100 generally includes a substrate 102 made of silicon dioxide (e.g., fused silica, glass, quartz etc.). A patterned layer having one or more features 104 is disposed on the substrate 102. By way of example, and without limitation, the patterned layer may contain an integrated circuit pattern, a pattern of or on a semiconducting device, a pattern of or on data storage media, a pattern on or of a passive optical device, or a pattern of or on an active optical device. The features 104 of the pattern may be made of chrome and etched using a photolithography process to form an image of an integrated circuit or other structure. The features 104 of the pattern may be part of a pattern for a design rule of 90 nm or less. A coating 106 made of a fluoride of a group IIA element covers features 104 of the patterned layer. By way of example, the coating may be a coating of calcium fluoride ($CaF_2$) or magnesium fluoride ($MgF_2$). Alternatively, the coating 106 may contain barium fluoride ($BaF_2$), beryllium fluoride ($BeF_2$), strontium fluoride ($SrF_2$) or radium fluoride ($RaF_2$).

A similar group IIA-fluoride coating 108 may cover the back side of the substrate 102. In general, the more critical side to coat would be the patterned surface as crystal defects can cause patterning errors on a wafer. However, there have been cases of crystal growth so dense on the backside of fused silica-based reticles dense enough to cause a global transmission loss through the reticle which can result in a global change of CD (critical dimensions) of lines on a wafer. In general the coatings 106, 108 are very thin and preferably have thicknesses that are much less than the wavelength of radiation used in conjunction with the mask 100. By way of example, the coatings 106, 108, if made, e.g., of $CaF_2$, can be only a few nanometers thick, e.g., less than about 10 nanometers, more specifically about 4 nanometers. In determining the thickness, it is important to consider optical thickness of the coatings 106, 108, which is defined the product of the geometrical thickness and the index of refraction n of the coating material. In general it is desirable that the optical thickness be less than about one eighth of the vacuum wavelength of the radiation. The index of refraction is generally a function of material, temperature and wavelength. For example, at a wavelength of 193 nm (6.42 eV), at 20.00° C. the absolute index of refraction of $CaF_2$ (in air) is n is about 1.50. At a wavelength of 193 nm (6.42 eV) at 20° C., the index of refraction of barium fluoride ($BaF_2$) n is about 1.57. For bulk $MgF_2$ at a wavelength of 200 m and a temperature of 19° C., the index of refraction n is about 1.42.

The material of the coatings 106, 108 are chosen to prevent undesired crystal growth on the silicon dioxide substrate 102. Group IIA fluorides can reduce or substantially eliminate the reactive nature of siloxyl groups on silicon dioxide (e.g., fused silica) substrates. The coating material is chosen to passivate the surface of the substrate 102. Such passivation is an economically attractive alternative to using a different substrate material. An additional benefit of full surface deposition of the coating 106 is that absorber materials used in forming the features 104 in the pattern layer (e.g., chrome or molybdenum siloxynitride (MoSiON)), typically include an anti-reflective (AR) coating. This coating may be partially eroded during standard processing. Coating the features 104 with the Group IIA fluoride coating 106 can provide what amounts to an additional AR coating if the coating is thick enough. By way of example, the coating 106 may be about 20 nanometers thick.

The coatings 106, 108 may be deposited on the substrate 102 by any suitable technique, such as vacuum deposition, physical vapor deposition (PVD or sputtering), chemical vapor deposition (CVD), electron beam deposition (EBD), and ion beam deposition (IBD). Preferably, the deposition technique produces coatings 106, 108 in the form of thin films with physical and optical properties that remain constant during storage, when under excimer laser exposure (primary use), during inspection of the mask 100, and during cleaning of the mask 100. EBD or IBD processes may be superior to PVD or CVD or vacuum deposition do to the optical purity and density of the resulting films.

Charged particle deposition systems for forming the coatings 106, 108 are commercially available and can be readily adapted to produce coatings of the desired group IIA fluorides. An example of a low-defect-density ion beam deposition is the NEXUS low-defect-density ion beam deposition (LDD-IBD) system, which is a high-performance production system available from Veeco Instruments of Rochester N.Y. Such a deposition system is suitable for photomask applications such as phase shift (PSM) and next-generation lithography technology such as EUV masks, due to its very good uniformity, high repeatability, and low particulate deposition. Commercially available IBD systems can deposit extremely thin single- and multilayer film coatings with angstrom accuracy. Its modular architecture also allows clusterability with other process modules for integrated solutions and a choice of an R&D/pilot line system or a high-throughput production system.

Figure 1B:
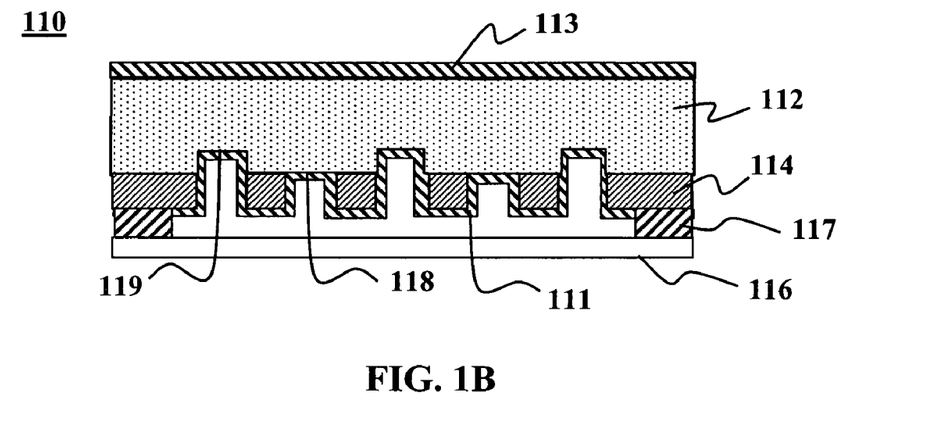
FIG. 1B is a cross-sectional schematic an alternating phase shift mask (altPSM) according to another embodiment of the present invention.

The mask 100 may be varied in many ways for application to a variety of different photolithographic techniques. For example, FIGS. 1B and 1C respectively depict an alternating phase shift mask (altPSM) 110 and a chromeless phase lithography (CPL) photomask 120 according to embodiments of the present invention. The altPSM 110 includes a $SiO_2$ (e.g., fused silica) mask substrate 112. By way of example the mask substrate 112 may be 6" by 6" by 0.25", a standard size used in the industry. A series of chrome lines 114 is disposed on a surface of the substrate 112 between 0° regions 118 and 180° regions 119, as described below with respect to FIG. 4. A pellicle 116 made of a polymer material is disposed over the pattern on the surface of the mask substrate 112. The pellicle 116 spaced apart from the substrate surface by a frame 117. A protective coating 111 containing a fluoride of a group IIA element covers the 0° 118 and the 180° regions 119 and the chrome lines 114. A similar protective group IIA-fluoride coating 113 may optionally cover a back surface of the altPSM 110

Figure 2A:
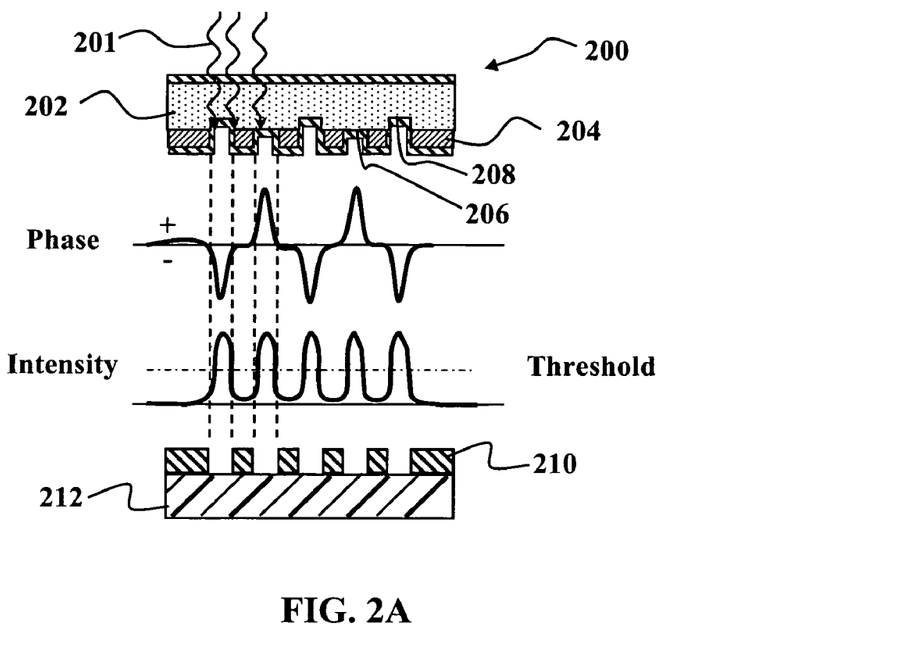
FIG. 2A is a cross-sectional schematic diagram illustrating the use of an alternating phase shift mask (altPSM) according to an embodiment of the present invention.

FIG. 2A illustrates the use of the group IIA fluoride coated altPSM 110 in photolithography. In the altPSM 110, alternating areas of chrome and 180 degree-shifted substrate material (e.g., fused silica) to form features on a wafer 212 that is covered by a layer of a resist 210. The altPSM 110 is made using a mask substrate 112 that is transparent to radiation 201. By way of example the radiation 201 may be characterized by a wavelength of about 150 nm or about 370 nm or some wavelength in between these two. The radiation passing through the mask imaged onto the resist layer 210 using an imaging system commonly known in the art. If the intensity at the radiation 201 impinging on the resist 210 is greater than a threshold, the resist will react. The chrome lines 114 on the mask substrate 112 are bordered on one side by regions 118 of the surface of the mask substrate of phase 0°, and on the other side by regions 119 of the surface of the mask substrate 112 that have been etched to a depth corresponding to a phase shift of 180° for radiation 201 that passes through the altPSM 110. The 0° regions 118 may be regions of a polished surface of the mask substrate 112. The 180° regions 119 may be in the form of trenches formed into the polished surface of the mask substrate 112. Alternatively, the 180° regions may be mesas of SiO$_2$ formed on the polished surface. Radiation passing through 0° regions 118 and 180° regions 119 interfere at the photoresist 210. As the phase goes from positive to negative, it passes through 0. The intensity (which is proportional to the square of the phase) of radiation impinging on the resist 210 also goes through 0, making a very dark and sharp line on the wafer 212 when the resist 210 is developed and the wafer 212 is etched.

Figure 1C:
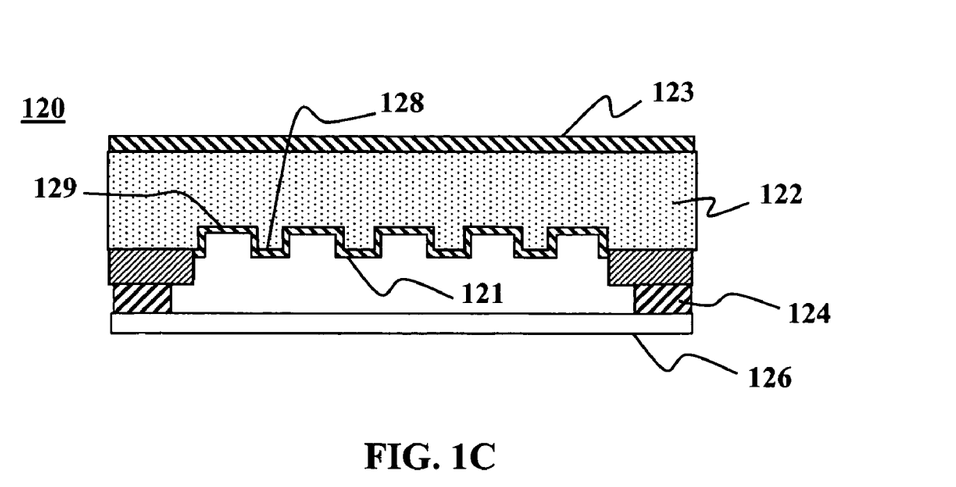
FIG. 1C is a cross-sectional schematic diagram of illustrating a chromeless phase lithography (CPL) mask according to another embodiment of the present invention.

Referring to FIG. 1C, the CPL mask 120 has a SiO$_2$ (e.g., fused silica) mask substrate 122 having a surface. One or more metal (e.g., chrome) lines that border a pattern of 0° regions 128 and 180° regions 129 formed on the surface. A pellicle 126 may be disposed over the pattern on the surface of the CPL mask substrate 122 and spaced apart from the mask surface by a frame 124. When used with radiation having a vacuum wavelength between about 150 nm and about 370 nm (e.g., 157-nm 193-nm and 248-nm radiation) the material of the pellicles 116, 126 depends on the wavelength of radiation used. By way of example, for 157-nm radiation the pellicles 116, 126 are typically made of quartz. In the case of 193-nm radiation and 248-nm radiation, the pellicles 116, 126 may be made of conventional polymers, e.g., fluoropolymers such as PTFE, and the like, typically used as pellicles. Examples of suitable polymers include amorphous per-fluoropolymers, such as Teflon AF® and Cytop® Teflon is a registered trademark of E.I. Du Pont De Nemours And Company of Wilmington Del. Cytop is a registered trademark of Asahi Glass Corporation of Tokyo, Japan.

Figure 2B:
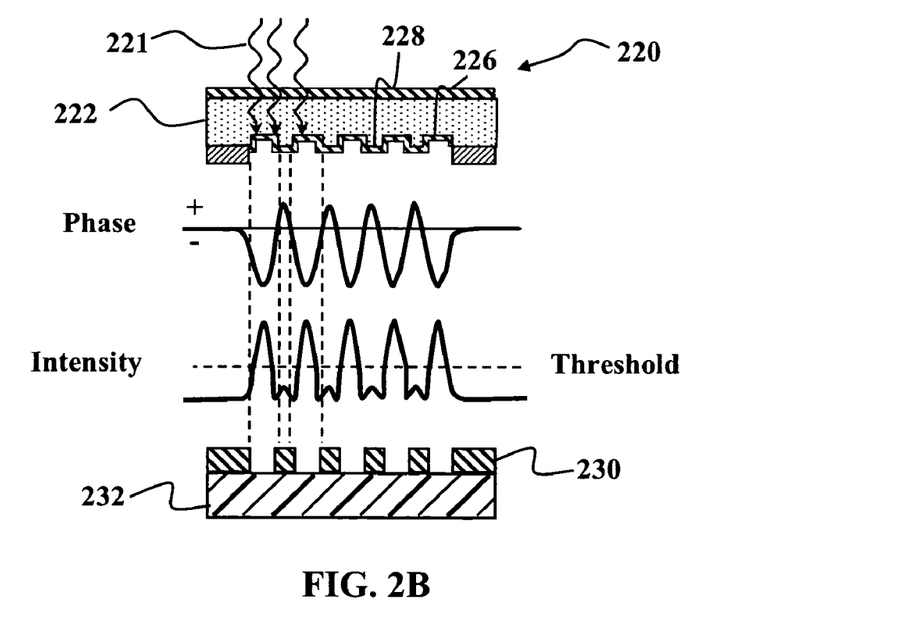
FIG. 2B is a cross-sectional schematic diagram of illustrating the use a chromeless phase lithography (CPL) mask according to another embodiment of the present invention.

FIG. 2B depicts the use of group IIA fluoride coated CPL mask 120, where each shifted feature on the mask forms a line on a wafer 232 covered by a resist 230. The mask 220 generally has a calcium fluoride substrate 222 with a surface having one or more metal (e.g., chrome) lines that border a pattern of 0° regions 226 and 180° regions 228 (e.g., trenches or mesas) that are at different heights than the 0° regions 226. Radiation 221 imaged from different regions of the mask 220 interferes at the photoresist layer 230. By forcing the phase to go through 0, the intensity (proportional to the square of the phase) also goes through 0, making a very dark and sharp line on the wafer 232 when the resist 230 is developed and the wafer 232 is etched.

Figure 3:
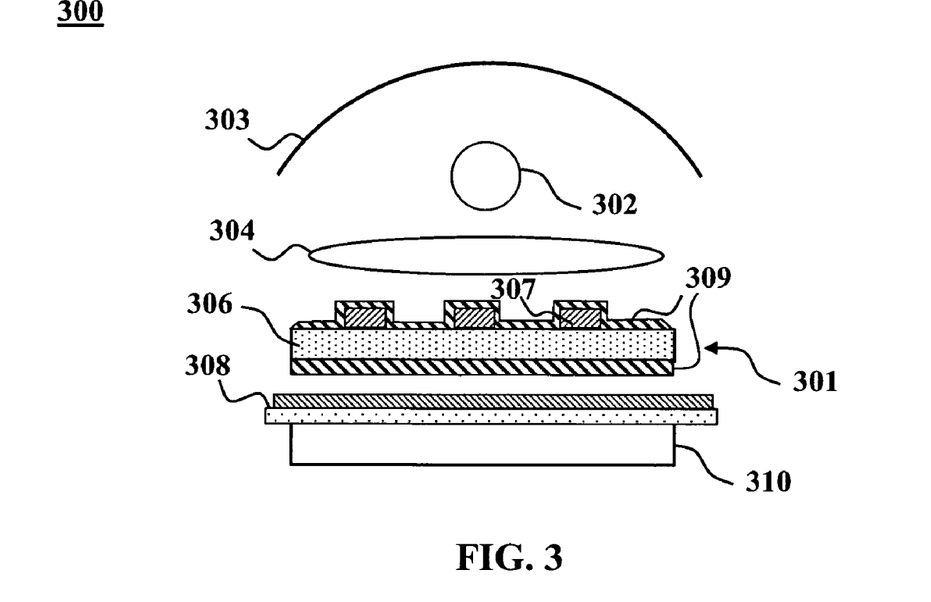
FIG. 3 is a schematic diagram of a photolithography system according to an embodiment of the present invention.

Masks of the types depicted above can be readily incorporated into photolithography systems. FIG. 3 depicts an example of a transmission photolithography system 300 according to an embodiment of the present invention. The system 300 generally includes light source 302 a lens 304, a photolithographic mask 301 and a substrate support 308.

The light source 302 produces radiation having characterized by vacuum wavelengths in a desired range. Typical wavelength ranges of interest include ultraviolet radiation, e.g., having wavelengths between about 150 nanometers and about 370 nanometers. By way of example and without limitation, the light source 302 may be a discharge lamp or excimer laser or other source of radiation commonly used in photolithography systems.

Radiation from the light source 302 is collected by an optional reflector 303 and focused with a lens 304 through the mask 301 onto a substrate 308 that is held by the support 310. The mask 301 includes a mask substrate 306, e.g., made of glass or quartz, bearing a pattern 307 in the form of the image of a portion of an integrated circuit. A coating 309 of a group IIA fluoride covers the pattern 307 and (optionally) may cover the backside of the substrate 306, as described above. The pattern is focused onto the surface of the substrate 308. The substrate 308 is typically covered with a photoresist that reacts when exposed to radiation. Portions of the photoresist that are exposed to the radiation react with light such that they are either easily removed (for a positive resist) or resistant to removal (for a negative resist), e.g., by a solvent. After removal of portions of the resist, a reduced image of the mask pattern is transferred to the photoresist. Portions of the substrate 308 may then be etched through openings in the pattern on the photoresist. Alternatively, material may be deposited onto the substrate 308 through the openings in the photoresist.

Examples of suitable photolithography systems that can utilize group IIA fluoride coated silicon dioxide photomasks include a TwinScan model XT:1400 from ASML Netherlands B.V. of Veldhoven, the Netherlands, a model S306C from Nikon Precision, Inc. of Belmont, Calif., or a model FPA-5000AS3 ArF from Canon U.S.A., Inc. of Lake Success, N.Y.

Figure 4A:
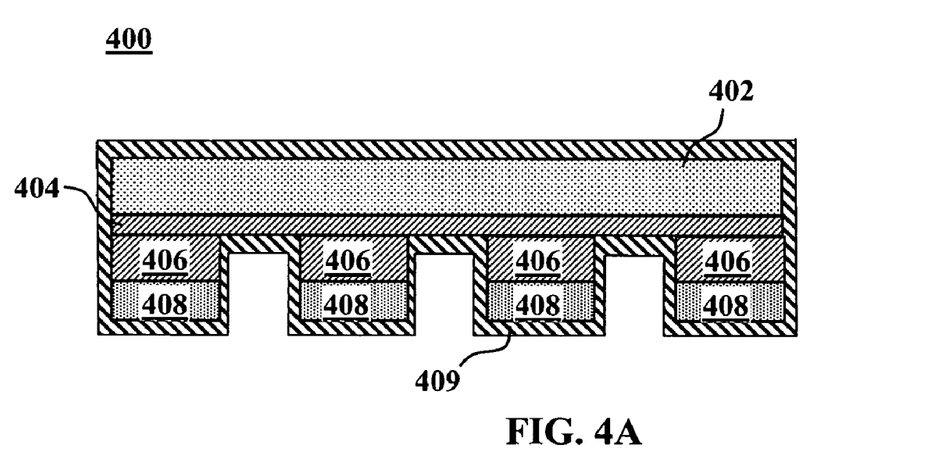
FIG. 4A is a cross-sectional schematic diagram of a reflective photolithography mask according to an embodiment of the present invention.

Coated masks of the type described herein may also be used for reflection photolithography. FIG. 4A depicts an example of a photomask 400 suitable for reflection photolithography that has been modified in accordance with an embodiment of the present invention. The mask 400 includes a silicon dioxide (e.g., fused silica) substrate 402, a reflective layer 404 and a layer of pattern features. The pattern features may be formed from an absorber layer 406 and an ARC layer 408 deposited over the reflective layer 404. Absorber layer 406 may be chromium about 70 nanometers in thickness, which can provide more than 99 percent absorption of the incident EUV at that thickness. Other materials being considered for use as an absorber layer include tantalum nitride, tantalum silicon nitride, tantalum silicon oxide, chromium nitride, tungsten, and ruthenium. Other metals may be found to be useful as well. ARC layer 408 is deposited over absorber layer 406. ARC 408 is a dielectric material that is preferably silicon oxide, silicon nitride, or aluminum oxide but may also be silicon oxynitride. A passivation coating 409 of a fluoride of a group IIA element covers the ARC pattern features and reflective layer 404.

Figure 4B:
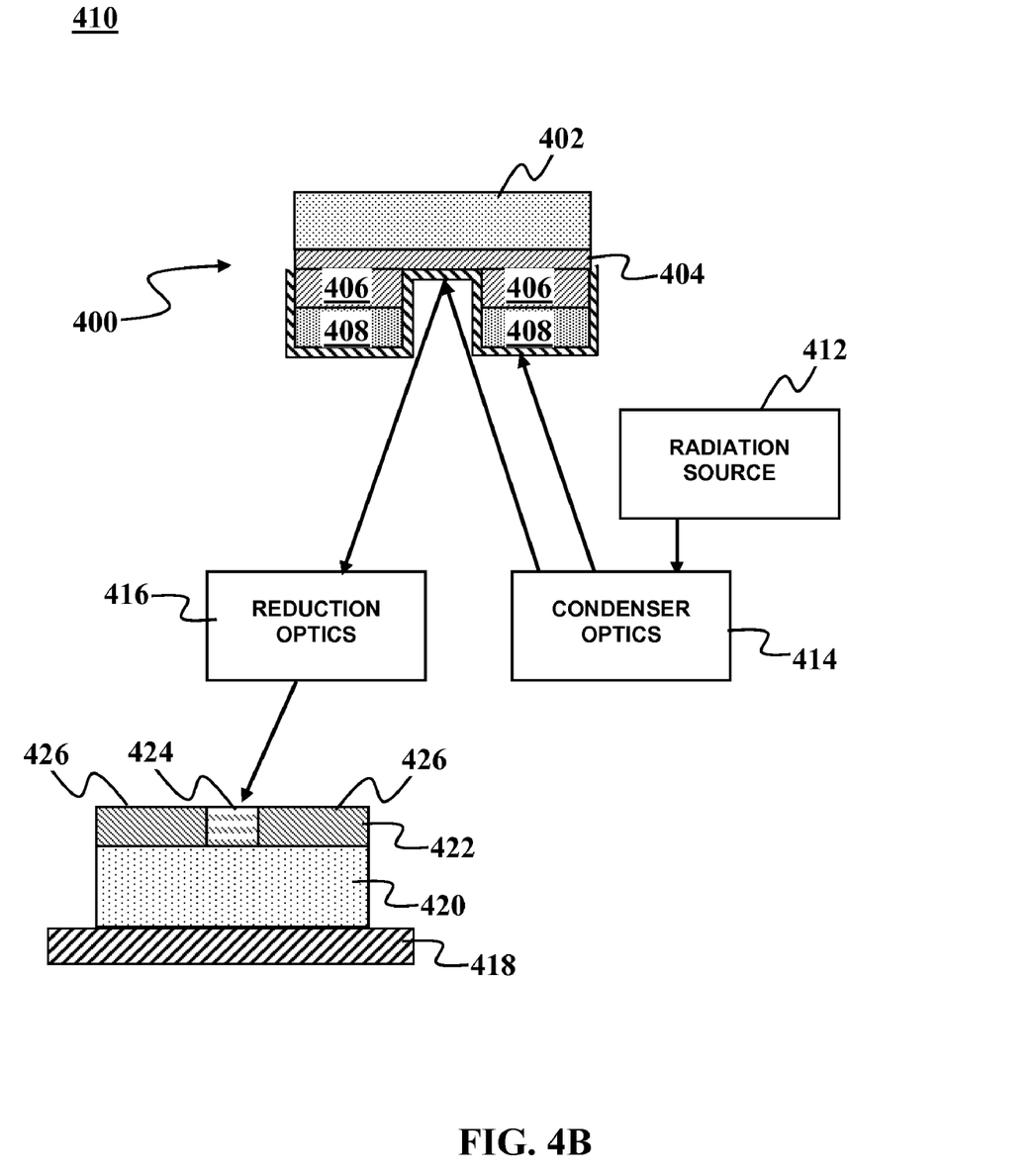
FIG. 4B is a schematic diagram of a reflective photolithography system according to an embodiment of the present invention.

FIG. 4B depicts a schematic diagram illustrating use of the reflection photomask 400 in a reflection photolithography system 410 suitable for use in extreme ultra violet (EUV) photolithography. The system 410 generally includes the photomask 400 (a portion of which is indicated schematically in FIG. 4B), a radiation source 412, condenser optics 414, reduction optics 416, and a substrate support 418 (e.g., a vacuum or electrostatic chuck). A substrate 420, e.g., a semiconductor wafer, is held by the support 418. A layer of photoresist 422 covers a surface of the substrate 420. The radiation source 412 provides the EUV radiation that is transmitted to the condenser optics 414. The condenser optics 414 illuminate the mask 400 the EUV radiation from the source 412. The EUV radiation reflects according to the pattern on mask 400. The reflected EUV radiation passes through reduction optics 416 and is imaged onto substrate 420. Radiation reflecting from the photo mask 400 at regions reflecting layer 404 between the pattern features exposes corresponding portions 424 of the photoresist layer 422. Radiation impinging on regions of the photomask covered by the absorber layer 406 and ARC 408 of the pattern features is not sufficiently reflected and, consequently, corresponding regions 426 of the photoresist layer 422 are not exposed. Further details of reflection masks and lithography systems can be found in U.S. Pat. No. 6,673,520, which is incorporated herein by reference.

In the drawings the photomasks 100, 110, 120, 301, and 400 are simplified to show a very small number of features to aid the explanation of the invention. In an actual mask, there could be millions, even billions, of features on a mask. The number is steadily increasing.

Although certain types of photomasks are described herein for the sake of example, other types of photomasks can benefit from protective coatings of the types described herein. For example, nano-imprint lithography masks can be made using silicon dioxide mask substrates with an imprint pattern on the front surface and a coating (e.g., a group IIA fluoride) designed to prevent absorption or chemisorption of organic compounds onto the front surface. Nano-imprint lithography is based on embossing adapted to the needs of semiconductor processing. Nano-imprint lithography is essentially a micro-molding process in which the topography of a template patterns a photoresist on a wafer. Unlike photolithography, imprint lithography does not use reduction optics. Instead, the size of the template determines the size of the pattern. Thus masks for nano-imprint lithography are often referred to as IX masks. Construction of a nano-imprint mask may be similar to that of the CPL mask 120 of FIG. 1C having the patterned substrate 122 with coatings 121, 123 providing an imprint template but without the frame 124 and pellicle 126.

While the above is a complete description of the preferred embodiment of the present invention, it is possible to use various alternatives, modifications and equivalents. Any feature, whether preferred or not, can be combined with any other feature, whether preferred or not. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A photolithographic mask suitable for use in photolithographically forming a pattern on a substrate, comprising:
   a silicon-dioxide mask substrate having a front surface;
   a patterned layer disposed on the front surface, wherein the patterned layer includes a pattern that has been etched into the front surface; and
   a coating of a fluoride of an element of group IIA that covers the patterned layer and the front surface.

2. The mask of claim 1 wherein the silicon-dioxide mask substrate is a fused silica substrate.

3. The mask of claim 2 wherein the fluoride of an element of group IIA is calcium fluoride ($CaF_2$), magnesium fluoride ($MgF_2$), barium fluoride ($BaF_2$), beryllium fluoride ($BeF_2$), strontium fluoride ($SrF_2$) or radium fluoride ($RaF_2$).

4. The mask of claim 1, wherein the coating is less than about 10 nm thick.

5. The mask of claim 1, further comprising a coating of a fluoride of an element of group IIA that covers the patterned layer and portions of a back surface of the silicon dioxide mask substrate.

6. The mask of claim 1, further comprising a reflective coating proximate the front surface whereby the mask is a reflective mask.

7. The mask of claim 6 wherein the patterned layer includes a patterned absorber, wherein the reflective layer is disposed between the patterned absorber and the mask substrate.

8. The mask of claim 1 further comprising a pellicle that covers the patterned layer, wherein the coating is between the pellicle and the patterned layer.

9. The mask of claim 1 wherein the patterned layer contains an integrated circuit pattern, a pattern to be formed on a semiconducting device, a pattern to be formed on data storage media, a pattern to be formed on a passive optical device, or a pattern to be formed on an active optical device.

10. The mask of claim 1 wherein the patterned layer is patterned for a design rule of about 90 nm or less.

11. The mask of claim 1 wherein the patterned layer is configured such that the mask is a chromeless phase lithography mask.

12. The mask of claim 1 wherein the patterned layer is configured such that the mask is an alternating phase shift mask.

13. The mask of claim 1 wherein the patterned layer is configured such that the mask is a nano-imprint lithography mask.

14. A photolithography system, comprising:
   a source of radiation;
   a substrate support;
   optics adapted to couple radiation between the source and the substrate support; and
   a photolithographic mask disposed along an optical path between the source of radiation and the substrate support, wherein the photolithographic mask includes
     a silicon-dioxide substrate having a front surface and a back surface,
     a patterned layer disposed on the front surface, wherein the patterned layer includes a pattern that has been etched into the front surface; and
     a coating of a fluoride of an element of group IIA that covers the patterned layer and the front surface.

15. The system of claim 14 wherein the silicon-dioxide substrate is a fused silica substrate.

16. The system of claim 15 wherein the fluoride of an element of group IIA is calcium fluoride ($CaF_2$), magnesium fluoride ($MgF_2$), barium fluoride ($BaF_2$), beryllium fluoride ($BeF_2$), strontium fluoride ($SrF_2$) or radium fluoride ($RaF_2$).

17. The system of claim 14 wherein the coating is less than about 10 nm thick.

18. The system of claim 14, further comprising a coating of a fluoride of an element of group IIA that covers the patterned layer and portions of the back surface.

19. The system of claim 14 wherein the patterned layer includes a patterned absorber, wherein the reflective layer is disposed between the patterned absorber and the mask substrate.

20. The system of claim 19 wherein the reflective layer is disposed between the patterned layer and the mask substrate.

21. The system of claim 19 wherein the optics includes a set of condenser optics and a set of reduction optics, wherein the photolithographic mask is disposed along an optical path between the condenser optics and the reduction optics.

22. The system of claim 14 further comprising a pellicle that covers the patterned layer, wherein the coating is between the pellicle and the patterned layer.

23. The system of claim 14 wherein the patterned layer contains an integrated circuit pattern, a pattern to be formed on a semiconducting device, a pattern to be formed on data storage media, a pattern to be formed on a passive optical device, or a pattern to be formed on an active optical device.

24. The system of claim 14 wherein the patterned layer is patterned for a design rule of about 90 nm or less.

25. The system of claim 14 wherein the patterned layer is configured such that the mask is a chromeless phase lithography mask.

26. The system of claim 14 wherein the patterned layer is configured such that the mask is an alternating phase shift mask.

27. The system of claim 14 wherein the patterned layer is configured such that the mask is a nano-imprint lithography mask.

28. A method for photolithography, comprising:
    forming a layer of photoresist on a substrate;
    disposing a reticle proximate the layer of photoresist, wherein the reticle includes a mask substrate made of a silicon oxide material, a patterned layer on a front surface of the mask substrate, wherein the patterned layer includes a pattern that has been etched into the front surface, and a layer of a fluoride of a group IIA element that covers the patterned layer and the front surface; and
    exposing the photoresist to radiation that impinges on the reticle.

29. The method of claim 28 wherein the reticle further includes a layer of a fluoride of a group IIA element on a back surface of the mask substrate.

30. The method of claim 28 wherein the mask is a chromeless phase lithography mask.

31. The method of claim 28 wherein the mask is an alternating phase shift mask.

32. The method of claim 28 wherein the mask is a nano-imprint lithography mask.

33. The method of claim 28 wherein the radiation has a vacuum wavelength of between about 150 nm and about 370 nm.

34. The method of claim 28 wherein the patterned layer contains a pattern for a design rule of 90 nm or less.

35. The method of claim 28 wherein the fluoride of an element of group IIA is calcium fluoride ($CaF_2$), magnesium fluoride ($MgF_2$), barium fluoride ($BaF_2$), beryllium fluoride ($BeF_2$), strontium fluoride ($SrF_2$) or radium fluoride ($RaF_2$).

36. The method of claim 28 wherein exposing the photoresist to radiation that impinges on the reticle includes transmitting the radiation through the reticle.

37. The method of claim 28 wherein exposing the photoresist to radiation that impinges on the reticle includes reflecting the radiation off a surface of the reticle.

38. A method for making a photolithographic mask, comprising the steps of:
    forming a patterned layer on a front surface of a silicon dioxide mask substrate, wherein the patterned layer includes a pattern that has been etched into the front surface; and
    covering the patterned layer and the front surface with a coating of a fluoride of an element of group IIA, wherein the resulting mask with the coating covering the patterned layer and front surface of the mask substrate is suitable for use in photolithographically forming a pattern on a substrate.

39. The method of claim 38 wherein the fluoride of an element of group IIA is calcium fluoride ($CaF_2$), magnesium fluoride ($MgF_2$), barium fluoride ($BaF_2$), beryllium fluoride ($BeF_2$), strontium fluoride ($SrF_2$) or radium fluoride ($RaF_2$).

40. The method of claim 38 wherein forming the coating includes the use of vacuum deposition, physical vapor deposition (or sputtering), chemical vapor deposition, electron beam deposition and ion beam deposition.

* * * * *

UNITED STATES PATENT AND TRADEMARK OFFICE
CERTIFICATE OF CORRECTION

PATENT NO. : 7,604,906 B1  Page 1 of 1
APPLICATION NO. : 11/231550
DATED : October 20, 2009
INVENTOR(S) : Volk et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 885 days.

Signed and Sealed this

Fifth Day of October, 2010

David J. Kappos
*Director of the United States Patent and Trademark Office*